United States Patent
Nagasaka

(10) Patent No.: US 9,629,265 B2
(45) Date of Patent: Apr. 18, 2017

(54) COOLING STRUCTURE OF ELECTRONIC DEVICE

(71) Applicant: NEC Corporation, Minato-ku, Tokyo (JP)

(72) Inventor: Yorito Nagasaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 550 days.

(21) Appl. No.: 13/780,005

(22) Filed: Feb. 28, 2013

(65) Prior Publication Data

US 2013/0231039 A1    Sep. 5, 2013

(30) Foreign Application Priority Data

Mar. 5, 2012 (JP) ................................. 2012-048062

(51) Int. Cl.
| | |
|---|---|
| *H05K 7/20* | (2006.01) |
| *H05K 5/00* | (2006.01) |
| *H05K 5/02* | (2006.01) |
| *H05K 7/14* | (2006.01) |

(52) U.S. Cl.
CPC ......... *H05K 5/0213* (2013.01); *H05K 7/1492* (2013.01); *H05K 7/20145* (2013.01)

(58) Field of Classification Search
CPC ............. H05K 5/0213; H05K 7/20145; H05K 7/1492; H05K 7/20727; G06F 1/20
USPC .............................. 454/184; 361/695, 679.02
See application file for complete search history.

(56) References Cited

U.S. PATENT DOCUMENTS

| | | | |
|---|---|---|---|
| 7,382,613 B2* | 6/2008 | Vinson | ...................... G06F 1/20 361/679.48 |
| 7,839,624 B2 | 11/2010 | Lin | |
| 2010/0000716 A1* | 1/2010 | Lian | ................... H01L 23/3672 165/80.3 |

(Continued)

FOREIGN PATENT DOCUMENTS

| | | |
|---|---|---|
| JP | 2000174465 A | 6/2000 |
| JP | 2005-11304 A | 1/2005 |
| JP | 2006-99773 A | 4/2006 |

(Continued)

OTHER PUBLICATIONS

Japanese Office Action for JP Application No. 2012-048062 mailed on Sep. 17, 2013 with English Translation.

(Continued)

*Primary Examiner* — Helena Kosanovic

(57) ABSTRACT

A cooling structure is designed for an electronic device including a plurality of fans causing cooling air, a plurality of electronic parts serving as heat sources, and a plurality of power source units, all of which are arranged inside the housing. The electronic parts are positioned in the downstream side of cooling air produced by the fans, while the power source units are positioned in the further downstream side of cooling air compared to the electronic parts. The power source units are spaced out from each other in the perpendicular direction to the cooling airflow direction of cooling air such that the power source units do not overlap with the electronic parts in the cooling airflow direction in plan view. The cooling structure prevents cooling air, which is temporarily warmed by the electronic parts, from directly flowing into the power source units, thus improving a cooling effect.

8 Claims, 4 Drawing Sheets

(56) References Cited

U.S. PATENT DOCUMENTS

2014/0073234 A1* 3/2014 Elison et al. ................ 454/184

FOREIGN PATENT DOCUMENTS

| JP | 2008-171386 A | 7/2008 |
| JP | 2008-269193 A | 11/2008 |

OTHER PUBLICATIONS

Japanese Office Action for JP Application No. 2012-048062 mailed on Apr. 22, 2014 with Partial English Translation.

* cited by examiner

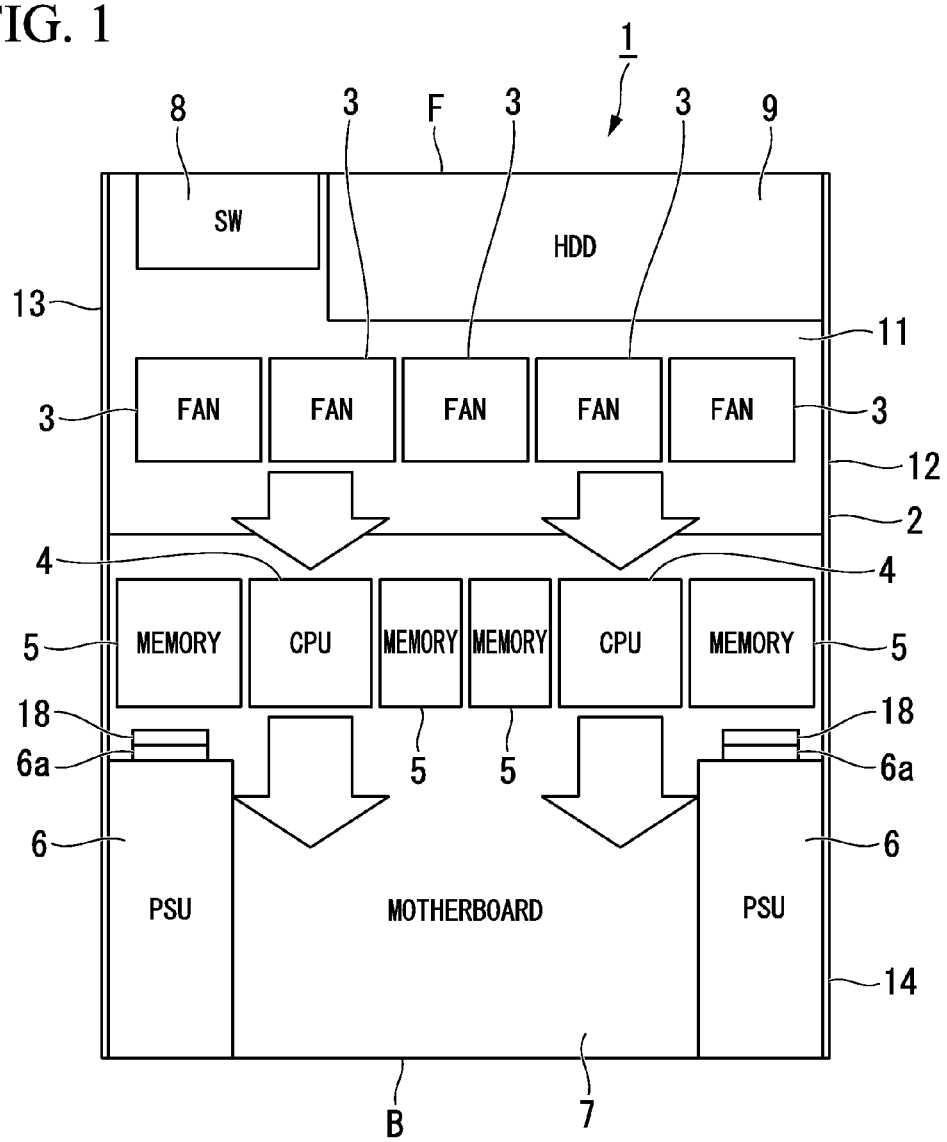

COOLING STRUCTURE OF ELECTRONIC DEVICE

BACKGROUND OF THE INVENTION

Field of the Invention

The present invention relates to a cooling structure of an electronic device such as a server, a host computer, and an industrial computer each equipped with a motherboard, a power source, and a cooling fan.

The present application claims priority on Japanese Patent Application No. 2012-48062, the content of which is incorporated herein by reference.

Description of the Related Art

Conventionally, electronic devices including power sources and electronic parts, serving as heat sources, need to be equipped with cooling fans for cooling heat sources. It is important for electronic devices, each including a plurality of electronic parts and a plurality of power sources (or power source units), to achieve a cooling structure for efficiently cooling heat sources.

Various technologies regarding cooling structures of electronic devices have been developed and disclosed in various documents. For example, Patent Literature 1 discloses a mounting structure of an electronic device including a plurality of logic units (e.g. CPUs), a plurality of power source units, and a plurality of fan units, wherein each power source unit is disposed in proximity to each logic unit. This technology aims to improve a cooling efficiency while preventing non-uniformity of power supply to each logic unit. Specifically, the housing of an electronic device is partitioned into a plurality of air passages, each of which allows cooling air to flow therethrough, wherein an air passage for each logic unit is separated from an air passage for each power source unit. Using each fan unit, cooling air is concurrently applied to air passages so as to cool each logic unit and each power source unit. However, the technology of Patent Literature 1 is disadvantageous because of its complex structure owing to the formation of air passages differently for each logic unit and each power source unit, which may increase the total weight of an electronic device.

Patent Literature 2 discloses an industrial computer chassis structure, which aims to optimize power supply to motherboards while reducing a power loss. The chassis shell (e.g. housing) of the industrial computer chassis structure is partitioned into various sections so as to mount a storage section, a fan section, a motherboard section, and a power source section in horizontally difference places. Herein, the power source section including a pair of power sources vertically combined together is disposed at the center position of the housing, while a pair of motherboards is horizontally disposed on both sides of the power source section; hence, the power source section is interposed between two mother boards, which are thus arranged as close to the power source section as possible. The fan section is located between the storage section and the motherboard section interposing the power source section. However, the technology of Patent Literature 2 may not demonstrate a good cooling effect when one power source additionally applies its heat to the other power source, thus totally increasing heat produced by a pair of power sources vertically combined together.

A server is one example of an electronic device including a plurality of electronic parts (e.g. CPUs) serving as heat sources. FIG. 6 is a plan view of a server 100 including a motherboard 101, a pair of CPUs 102, a housing 103, a plurality of fans 104, and a pair of power source units (or power supply units: PSU) 105. Herein, two CPUs 102 are mounted on the motherboard 101, while five fans 104 are aligned along the width direction of the housing 103. The intake side of each fan 104 is directed toward the width of the housing 103, while the outlet side of each fan 104 is directed toward each CPU 102. The two CPUs 102 are disposed in parallel with a predetermined gap therebetween and collectively disposed in the outlet direction of the fans 104 (i.e. the downstream direction of cooling air). Thus, it is possible to efficiently cool the CPUs 102 which are disposed in parallel and collectively exposed to a cooling air flow caused by the fans 104.

The server 100 has a redundant power source configuration using the two power source units 105 which may concurrently supply electric power to the CPUs 102. The server 100 is designed to adjacently dispose the two power source units 105 in a further downstream side of a cooling air flow compared to the CPUs 102.

In the server of FIG. 6, one CPU 102 and one power source unit 105 are positioned linearly along a cooling air flow; hence, a cooling air flow caused by the fan 104 is temporarily warmed by heat caused by the CPU 102 and subsequently flows into the power source unit 105. This may degrade a cooling effect for the power source unit 105 in the server 100.

Due to the adjacent arrangement of the power source units 105, one power source unit 105 additionally applies its heat to the other power source unit 105. This may further degrade a cooling effect for the power source units 105.

In order to adequately cool the power source units 105 in the server 100, it is necessary to increase the speed of rotation of the fans 104 or the internal fans (not shown) embedded in the power source units 105, thus improving an airflow rate with the fans 104 or the internal fans (hereinafter, collectively referred to as cooling fans). Alternatively, it is necessary to increase the number of fans 104 or to use high-performance fans for the server 100. This may increase the cost price of the server 100. Moreover, this may entail unnecessary limitation to the size and capacity of the server 100 so as to prevent an increase in a heating value of each power source unit 105

CITATION LIST

Patent Literature

Patent Literature 1: Japanese Patent Application Publication No. 2000-174465
Patent Literature 2: U.S. Pat. No. 7,839,624

SUMMARY OF THE INVENTION

It is an object of the present invention to provide a simple cooling structure of an electronic device demonstrating a high cooling effect for power source units supplying electric power to CPUs.

The present invention is directed to an electronic device covered with a housing having a front face and a rear face which are distanced from each other in the longitudinal direction. The electronic device includes a plurality of fans which are arranged inside the housing so as to cause cooling air to propagate in the longitudinal direction of the housing, a plurality of electronic parts (e.g. CPUs) serving as heat sources, which are arranged inside the housing and positioned in the downstream side of the cooling air caused by the plurality of fans, and a plurality of power source units which are arranged inside the housing. Each power source unit is able to produce adequate electric power to drive the electronic device.

The present invention aims to create a simple cooling structure for the electronic device. Specifically, the power source units are collectively positioned in the further downstream side of cooling air compared to the electronic parts. Additionally, the power source units are spaced out from each other in the width direction of the housing, perpendicular to the cooling airflow direction of cooling air, in such a way that the power source units do not overlap with the electronic parts in the cooling airflow direction.

Thus, it is possible to improve a cooling effect for the power source units which are positioned close to the electronic parts serving as heat sources.

BRIEF DESCRIPTION OF THE DRAWINGS

These and other objects, aspects, and embodiments of the present invention will be described in more detail with reference to the following drawings.

FIG. 1 is a plan view of an electronic device according to a first embodiment of the present invention.

FIG. 2 is a rear view of the electronic device.

DESCRIPTION OF THE PREFERRED EMBODIMENT

The present invention will be described in further detail by way of examples with reference to the accompanying drawings.

1. First Embodiment

Figure 3:
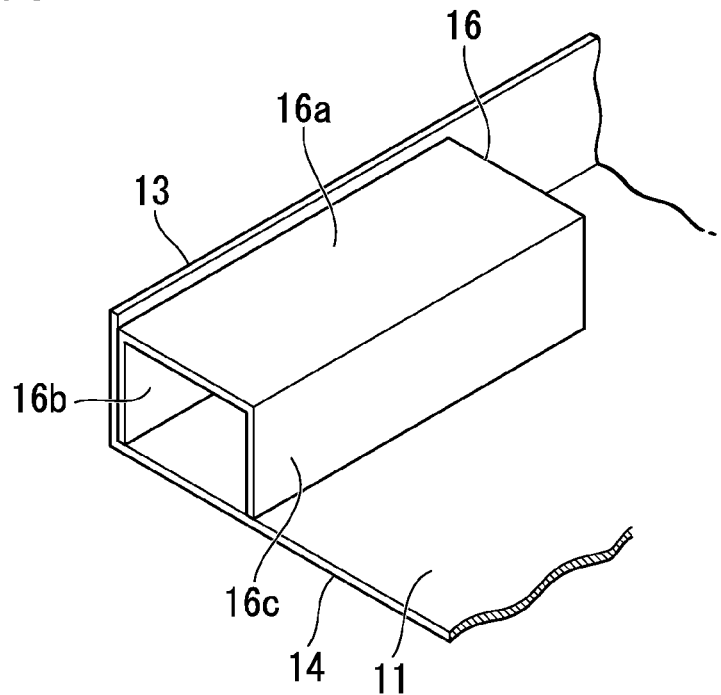
FIG. 3 is a perspective view showing a part of the rear side of the electronic device having a power box.

An electronic device (i.e. a server) 1 according to a first embodiment of the present invention will be described with reference to FIGS. 1 to 4. FIG. 1 is a plan view of the server 1 partly in cross section; FIG. 2 is a rear view of the server 1; and FIG. 3 is a perspective view showing a power box installed in the server 1.

The server 1 includes a housing 2, five fans 3, two CPUs 4 (i.e. electronic parts serving as heat sources), four memories 5, two power source units (or power supply units: PSU) 6, a motherboard 7, a switching device (SW) 8, and a hard disk drive (HDD serving as an auxiliary storage device) 9. Herein, each CPU 4 is accompanied with a pair of memories 5 on the left and right sides thereof. In FIG. 1, a reference sign F denotes a front face of the server 1, while a reference sign B denotes a back face (or a rear face) of the server 1.

As shown in FIG. 2, the housing 2 includes a main frame 14 and a cover 15. The main frame 14 includes a pair of side boards 12, 13 which are vertically formed on the right and left sides thereof. The cover 15 is detachably attached to the upper portion of the main frame 14 so as to cover the upper opening of the main frame 14. The housing 2 has a quadratic-prismatic shape whose front and rear faces are not closed. A pair of power boxes 16 for installing the power source units 6 is fixed to the opposite sides in the rear portion of the main frame 14. FIG. 3 shows the power box 16 including a top board 16a and a pair of side boards 16b, 16c which are bent downwardly from the left and right sides of the top board 16a. FIG. 3 shows the left-side power source unit 6 with the left side board 16b positioned in contact with the left side board 13 of the main frame 14. The rear-side end portion of the power box 16 is positioned to match with the rear-side end portion of the main frame 14 in plan view. FIG. 1 shows an uncovered state of the main frame 14 for installing the foregoing parts, barring the cover 15, without illustrating the power boxes 16.

The CPUs 4 and the memories 5 are mounted on the motherboard 7, while the cooling fans 3, the power source units 6, the motherboard 7, the switching device 8, and the hard disk drive 9 are mounted on a base board 11 of the main frame 14. To allow any user to manually operate the switching device 8 and the hard disk drive 9 via the front face F of the server 1, the switching device 8 and the hard disk drive 9 are aligned along the front face F of the main frame 14 in the width direction of the main frame 14. That is, the front face F is an operation part of the server 1.

The fans (i.e. cooling fans) 3 are linearly aligned in the width direction of the main frame 14 and are positioned in the back side of the main frame 14 compared to the switching device 3 and the hard disk drive 9. Each fan 3 is appropriately positioned and designed to cause an air flow in a longitudinal direction from the front side to the rear side in the housing 2.

The motherboard 7 is positioned in the back side of the main frame 14 compared to the fans 3. The entirety of the motherboard 7 has a T-shape in plan view so as to circumvent the power boxes 16. The rear-side end portion of the motherboard 7 is positioned to match with the rear-side end portion of the main frame 14 in plan view.

The CPUs 4 and the memories 5 are linearly aligned along the front side of the motherboard 7 in the width direction of the main frame 14. The CPUs 4 and the memories 5 are alternately aligned to adjoin together in such a way that a pair of memories 5 is positioned on the left and right sides of the main frame 14 while another pair of memories 5 is adjacently positioned in the center portion of the main frame 14 in the width direction. Additionally, each CPU 4 is positioned between a pair of memories 5. A pair of heat sinks 17 is positioned above a pair of CPUs 4.

A pair of power boxes 16 which are positioned on the left and right sides of the main frame 14 is positioned in the back of a pair of memories 5 which are positioned on the left and right sides of the main frame 14 in the width direction. One power source unit 6 is installed in each of the power boxes 16 which are positioned apart from each other. Additionally, the power boxes 16 are positioned not to be overlapped with the CPUs 4 in each of the width direction and the longitudinal direction of the housing 2.

The power source units 6 are equipped with external connectors 6a on the front ends thereof, while internal connectors 18 are attached to the motherboard 7. The external connectors 6a of the power source units 6 are connected to the internal connectors 18 mounted on the motherboard 7.

The power box 16 is designed to keep the power source unit 6 without any clearance therein. The power box 16 has an adequate size which allows the power source unit 6 to freely move in the longitudinal direction. The power boxes 16 installing the power source units 6 are appropriately positioned such that the external connectors 6a of the power source units 6 can be engaged with and electrically connected to the internal connectors 18, wherein the rear faces of the power source units 6 are positioned to match with the rear face of the housing 2.

The power source units 6 can be pulled out of the rear face B of the server 1. In the connected state in which the external connectors 6a of the power source units 6 are connected to the internal connectors 18 mounted on the motherboard 7, when the power source units 6 are pulled in the rear direction of the housing 2, it is possible to disengage the external connectors 6a from the internal connectors 18, thus achieving an electrically disconnected state. This may allow any user to easily pull out the power source units 6 from the rear side of the housing 2.

Each power source unit 6 produces adequate electric power to operate the server 1. In other words, each one of the power source units 6 is able to operate the server 1. In the normal condition, however, the two power source units 6 are driven to concurrently apply electric power to the server 1.

In the server 1, the fans 3 are driven to blow air in the longitudinal direction from the front side to the rear side of the housing 2. This causes a cooling airflow in the longitudinal direction (see arrows) from the front side to the rear side of the housing 2.

In FIG. 1, both the power source units 6 are positioned in the downstream side of a cooling air flow compared to the CPUs 4, whereas the power source units 6 are not longitudinally aligned to follow the CPUs 4 in a cooling airflow direction; hence, the power source units 6 do not positionally overlap with the CPUs 4 in the rear view shown in FIG. 2. Additionally, the power source units 6 are spaced out from each other in the perpendicular direction to the cooling air flow, i.e. the width direction of the housing 2.

Among the electronic parts included in the server 1, the CPUs 4 are the heat sources producing the highest heat value, while the power source units 6 are the heat sources producing the second highest heat value. Cooling air caused by the fans 3 sequentially passes through the CPUs 4 and the memories 5 and then further flows into the downstream side. Since the CPUs 4 do not longitudinally overlap with the power source units 6 in the cooling airflow direction, cooling air firstly cools the CPUs 4 and then propagates straight through a gap area formed between the power source units 6; thereafter, cooling air may flow out of the rear face of the housing 2. This reliably prevents cooling air, which is temporarily warmed by the CPUs 4, from directly flowing into the power source units 6.

Meanwhile, cooling air passing through the memories 5 flows into the power source units 6, wherein cooling air actually applied to the power source units 6 is sufficiently low in temperature. In other words, the present embodiment is designed to lower the temperature (i.e. an intake temperature) of cooling air actually flowed into the power source units 6. Thus, it is possible to adequately cool down the power source units 6. Since the power source units 6 are mutually spaced from each other in the perpendicular direction to the cooling airflow direction, it is possible to reliably prevent heat generated by one power source unit 6 from being additionally applied to the other power source unit 6.

As described above, the present embodiment may maximize a cooling effect for the power source units 6 installed in the server 1 because the CPUs 4 do not longitudinally overlap with the power source units 6 in the cooling airflow direction while the power source units 6 are spaced out from each other in the perpendicular direction to the cooling airflow direction, i.e. the width direction of the housing 2. This may reduce an airflow rate of the fans 3 cooling the power source units 6 while reducing the speed of rotation of the cooling fans (i.e. the fans 3 or the internal fans embedded in the power source unit 6). Additionally, this may reduce power consumption of the cooling fans while reducing noise caused by the cooling fans. Compared to the conventional layout for arranging a plurality of cooling fans, it is possible to reduce the number of cooling fans for cooling the power source units 6. This may contribute to a reduction of the cost price of the server 1.

By suppressing an increase of temperature in the power source units 6, it is possible to reduce a failure rate of the power source units 6 and to improve the durability of the power source units 6, thus increasing the life of the server 1.

Due to a high cooling effect on the power source units 6, it is possible to employ high-density power source units with relatively small volumes producing adequate power as the power source units 6. In this case, it is possible to reduce the entire size of the housing 2 by using the high-density power source units 6. Alternatively, it is possible to enlarge an installation area of the housing 2 accommodating the motherboard 7 irrespective of the size of the housing 2.

The present embodiment is advantageous in that even when one power source unit 6 fails, the other power source unit 6 is able to drive the server 1, in other words, the normally-functioning power source unit 6 may solely produce adequate electric power to drive the server 1. This allows any user to remove the failed power source unit 2 from the housing 2, thus performing maintenance with ease.

The present embodiment is characterized in that all the electronic parts of the server 1 (i.e. the fans 3, the CPUs 4, the memories 5, the power source units 6, the switching device 8, and the hard disk drive 9) are horizontally arranged in the same plane. This may reduce the height of the server 1 while simplifying the structure of the server 1.

Figure 4:
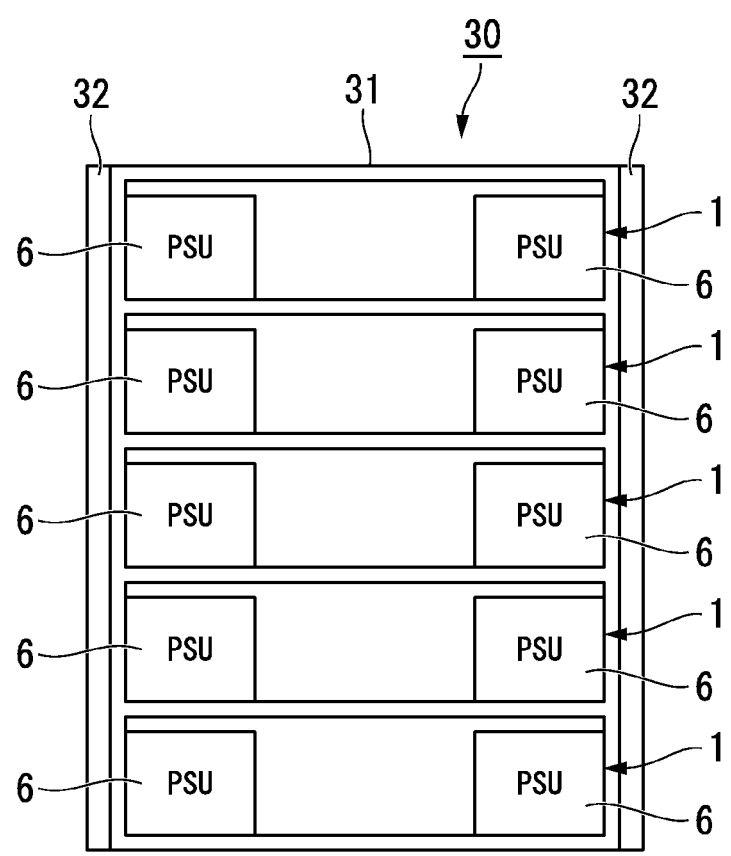
FIG. 4 is a back view of a rack-mounting server including a plurality of servers mounted on racks.

FIG. 4 shows an example of a rack-mounting server for installing a plurality of servers 1 which can be vertically arranged in a rack 31. The rack 31 includes a plurality of wiring sections for collectively wiring power cables on the opposite sides thereof. When the power source units 6 are arranged in proximity to the side boards 12, 13 of the housings 2 of the server 1, it is possible to easily wire the power cables of the power source units 6 in the wiring sections of the rack 31.

2. Second Embodiment

Figure 5:
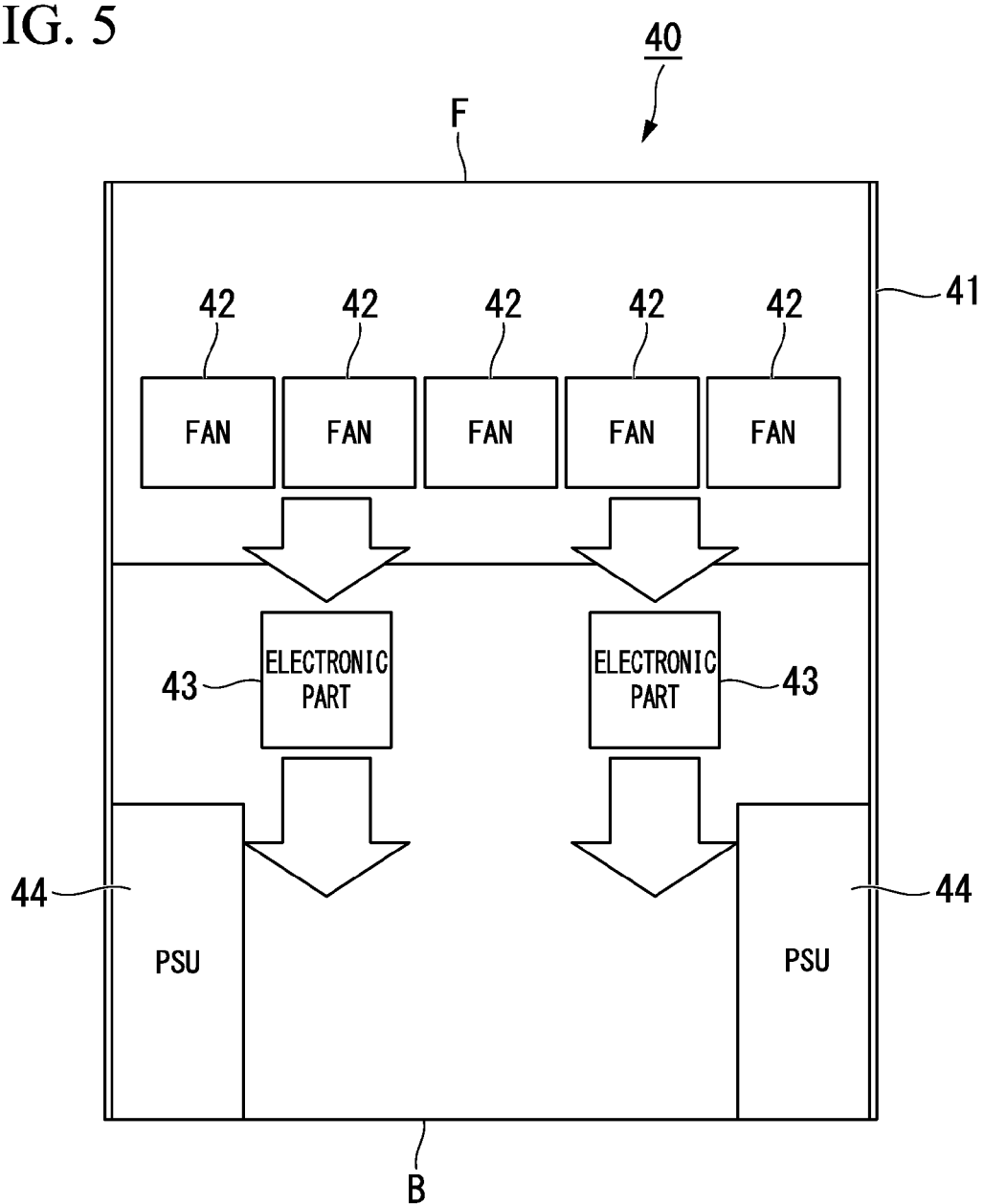
FIG. 5 is a plan view of an electronic device according to a second embodiment of the present invention.
Figure 6:
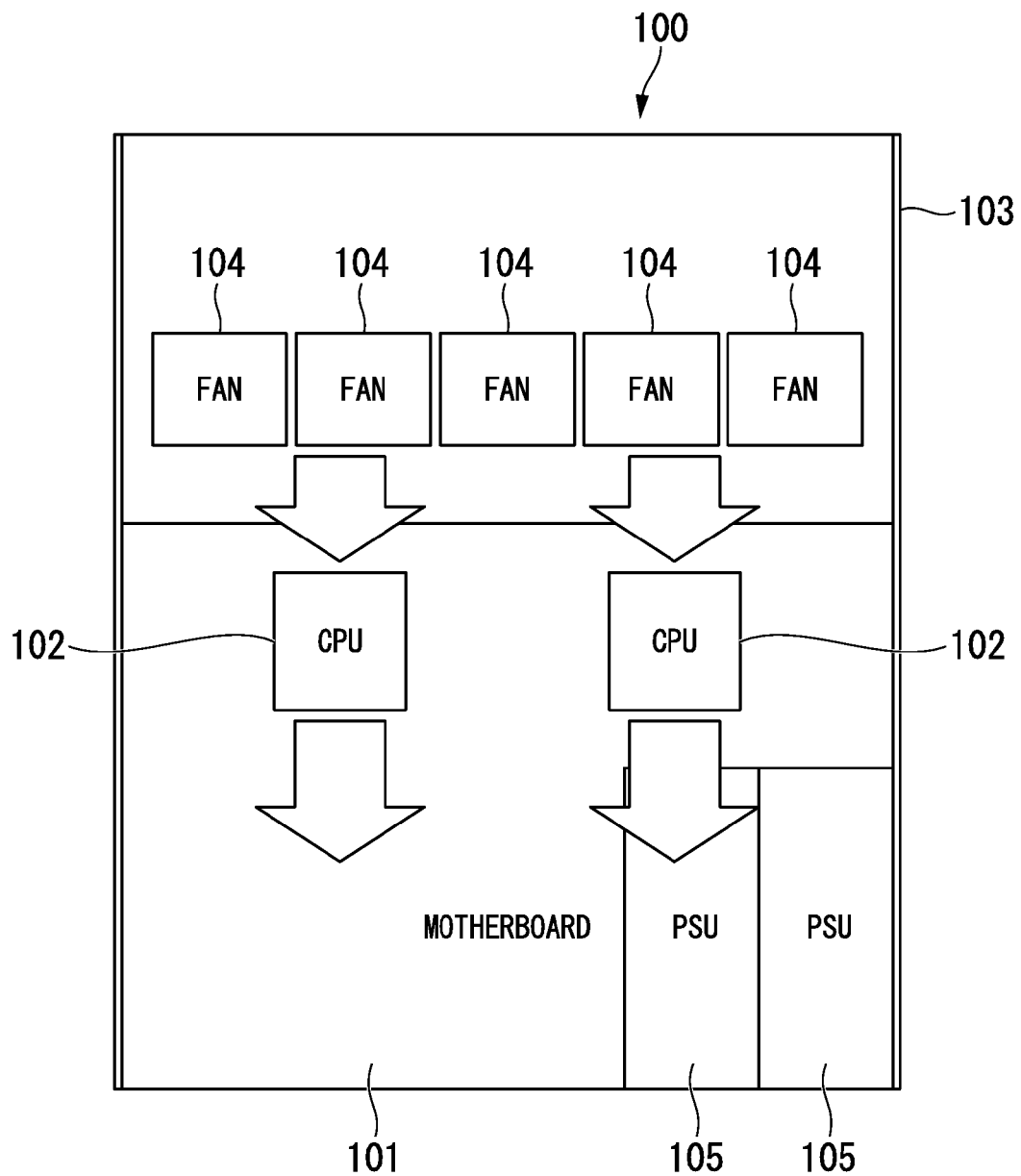
FIG. 6 is a plan view of a server including a plurality of fans concurrently cooling a pair of CPUs and a pair of power source units.

Next, an electronic device 40 according to a second embodiment of the present invention will be described with reference to FIG. 5. The electronic device 40 is configured using a housing 41 having a front face F and a back face (or a rear face) B. The electronic device 40 includes a plurality of fans 42, a pair of electronic parts 43 serving as heat sources, and a pair of power source devices 44, all of which are arranged inside the housing 41. The fans 42 cause cooling air to propagate from the front face F to the rear face B in the housing 41. The electronic parts 43 are positioned in the downstream side of cooling air produced by the fans 42. One of the power source units 44 may solely produce adequate electric power to drive the electronic device 40. The power source units 44 are arranged in the downstream side compared to the electronic parts 43. The power source units 44 are spaced from each other in the direction perpendicular to the cooling airflow direction so that they may not overlap with the electronic parts 43 in rear view. The electronic device 40 is designed to prevent cooling air, which is temporarily warmed by the electronic parts 43, from directly flowing into the power source units 44. Thus, it is possible to improve cooling performance for the power source units 44.

The present invention is not necessarily limited to the foregoing embodiments, which can be further modified in various ways.

The electronic device 1 of the first embodiment may not necessarily include two power source units 6, but the number of power source units can be increased to three or more. Additionally, the electronic device 1 of the first embodiment may not necessarily include two CPUs 4, but the number of CPUs can be changed to one or three or more. Furthermore, the number of fans 3 is not necessarily limited to five, but the number of fans can be increased or decreased to an arbitrary number.

In the electronic device 1, the power source units 6 are not necessarily arranged in proximity to the opposite side ends of the housing 2; hence, the power source units 6 can be positioned slightly apart from the opposite side ends of the housing 2. In short, the present invention should be designed such that power source units and electronic parts serving as heat sources do not overlap with each other in the cooling airflow direction while power source units are spaced out from each other in the perpendicular direction to the cooling airflow direction, e.g. the width direction of the housing.

The first embodiment is described such that the CPUs 4 may represent electronic parts serving as heat sources; hence, electronic parts are not necessarily limited to CPUs. Additionally, the servers 1 and 40 do not necessarily exemplify an electronic device of the present embodiment; hence, it is possible to apply the present invention to any types of electronic devices including cooling fans and heat sources.

Lastly, the present invention is not necessarily limited to the foregoing embodiments and variations, which can be further modified in various ways within the scope of the invention as defined in the appended claims.

What is claimed is:

1. An electronic device comprising:
   a housing comprising a front face and a rear face which are distanced from each other in a longitudinal direction;
   a plurality of fans which are arranged inside the housing close to the front face so as to cause cooling air to flow downstream in the longitudinal direction from the front face to the rear face of the housing;
   a central processing unit (CPU) which is arranged downstream of the plurality of fans in the housing and positioned to allow the cooling air to directly flow therethrough;
   a plurality of memory devices adjacent to the CPU in a width direction, substantially normal to the longitudinal direction, of the housing; and
   a plurality of power source units which are positioned opposite to each other and spaced out from each other in the width direction of the housing,
   wherein the plurality of power source units are each positioned further downstream of the cooling air from the plurality of memory devices such that the cooling air passing through one of the memory devices passes into one of the power source units, and
   wherein the plurality of power source units are each positioned not to be aligned linearly with the CPU in the longitudinal direction of the housing.

2. The electronic device according to claim 1, wherein the plurality of power source units are each arranged to be pulled out from the rear face of the housing.

3. The electronic device according to claim 1, wherein the plurality of power source units are each kept inside a power box, comprising a top board and a pair of side boards, and positioned close to each of side faces of the housing so as not to directly interfere with the cooling air flown downwardly from the plurality of electronic parts.

4. A cooling structure of an electronic device comprising a plurality of fans causing cooling air to flow downstream, a central processing unit (CPU), a plurality of memory devices adjacent to the CPU, and a plurality of power source units, all of which are arranged along a flowing direction of the cooling air corresponding to a longitudinal direction in a housing,
   wherein the CPU is arranged downstream of the plurality of fans and positioned to allow the cooling air to directly flow therethrough,
   wherein the plurality of power source units are each positioned further downstream of the cooling air from the plurality of memory devices such that the cooling air passing through one of the memory devices passes into one of the power source units,
   wherein the plurality of power source units are positioned opposite to each other and spaced out from each other in a width direction of the housing such that the plurality of power source units are positioned not to be aligned linearly with the CPU in the longitudinal direction.

5. The electronic device according to claim 1, wherein the plurality of power source units are each positioned along an extension downstream from the plurality of memory devices.

6. The electronic device according to claim 1, wherein the cooling air flows through a heat sink, attached onto the CPU, and further flows downstream via a relatively large space formed between the plurality of power source units.

7. The cooling structure of an electronic device according to claim 4, wherein the plurality of power source units are each positioned along an extension downstream from the plurality of memory devices.

8. The electronic device according to claim 1, wherein
   the plurality of fans are arranged in a direction normal to the longitudinal direction,
   the central processing unit is positioned in a first row,
   the first row extending parallel to the direction,
   the plurality of power source units are each positioned in a second row,
   the second row extending parallel to the direction,
   the second row being positioned farther from a longitudinal center of the housing than the first row,
   and the second row being positioned farther from the plurality of fans that the first row.

\* \* \* \* \*